(12) United States Patent
Horie

(10) Patent No.: US 6,531,921 B2
(45) Date of Patent: Mar. 11, 2003

(54) OPERATIONAL AMPLIFIER

(75) Inventor: Masakiyo Horie, Gamagoori (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/960,370

(22) Filed: Sep. 24, 2001

(65) Prior Publication Data

US 2002/0050862 A1 May 2, 2002

(30) Foreign Application Priority Data

Sep. 27, 2000 (JP) ........................................ 2000-294093

(51) Int. Cl.[7] ................................................ H03F 3/45
(52) U.S. Cl. ........................ 330/255; 330/261; 330/280
(58) Field of Search ................................. 330/253, 255, 330/260, 261, 267, 273, 280, 281, 310, 311

(56) References Cited

U.S. PATENT DOCUMENTS

| | | | |
|---|---|---|---|
| 4,538,114 A | | 8/1985 | Kunimi et al. ............... 330/253 |
| 4,829,266 A | * | 5/1989 | Pernici et al. ............... 330/253 |
| 5,410,273 A | * | 4/1995 | Brehmer et al. ............ 330/253 |
| 5,892,540 A | * | 4/1999 | Kozlowski et al. ......... 348/300 |
| 6,121,829 A | * | 9/2000 | Tokura ........................ 329/341 |

FOREIGN PATENT DOCUMENTS

| | | |
|---|---|---|
| EP | 0446652 A1 | 9/1991 |
| JP | A-58-218225 | 12/1983 |
| JP | A-59-43614 | 3/1984 |
| JP | A-4-220806 | 8/1992 |
| JP | A-6-152274 | 5/1994 |

* cited by examiner

Primary Examiner—Timothy P. Callahan
Assistant Examiner—An T. Luu
(74) Attorney, Agent, or Firm—Law Offices of David G. Posz

(57) ABSTRACT

An operational amplifier includes a differential amplification circuit, a voltage amplification circuit, a capacitor, and a bias setting circuit. The differential amplification circuit includes load transistors arranged in a cascode connection. The voltage amplification circuit forms a stage following the differential amplification circuit. The capacitor couples the differential amplification circuit and the voltage amplification circuit with each other. The bias setting circuit charges the capacitor to a prescribed bias voltage before amplification is started. Preferably, the charged capacitor sets the differential amplification circuit in a prescribed biased state.

11 Claims, 7 Drawing Sheets

OPERATIONAL AMPLIFIER

BACKGROUND OF THE INVENTION

1. Field of the Invention

This invention relates to an operational amplifier including a differential amplification circuit of a cascode connection type.

2. Description of the Related Art

Japanese patent application publication number 58-218225 discloses a MOS transistor amplifier designed to operate at an increased speed. The amplifier in Japanese application 58-218225 includes a differential amplification circuit, a first MOS transistor, a capacitor, a second MOS transistor, and a switch. The gate of the first MOS transistor is connected with the output terminal of the differential amplification circuit. One end of the capacitor is connected with the output terminal of the differential amplification circuit, and with the gate of the first MOS transistor. The other end of the capacitor is connected with the gate of the second MOS transistor. The switch is used in controlling the application of a bias voltage to the gate of the second MOS transistor. When the switch is in its on state, the voltage at the gate of the second MOS transistor is fixed to a level provided by a bias circuit. When the switch is in its off state, a variation in the voltage at the output terminal of the differential amplification circuit is transmitted to the gates of the first and second MOS transistors. During a time interval immediately before a pulse voltage inputted to the differential amplification circuit rises, the switch is held in its on state to charge the capacitor. Also, during a time interval immediately before the pulse voltage drops, the switch is held in its on state to charge the capacitor. During other time intervals, the switch is held in its off state.

Japanese patent application publication number 6-152274 discloses an amplifier including a first differential amplification circuit, a first emitter follower circuit, a second differential amplification circuit, a second emitter follower circuit, and a bias circuit. The first differential amplification circuit, the first emitter follower circuit, the second differential amplification circuit, and the second emitter follower circuit are sequentially connected in that order. The bias circuit applies a bias voltage to the base of a transistor within the second differential amplification circuit. The bias circuit includes a capacitor connected between a power feed line and the base of the transistor.

U.S. Pat. No. 4,538,114 corresponding to Japanese patent application publication number 59-43614 discloses a differential amplifier formed of MISFETs. The differential amplifier in U.S. Pat. No. 4,538,114 includes a differential amplification stage and a pair of cascode amplification stages which receive outputs from the differential amplification stage. In each of the cascode amplification stages, an amplifying MISFET which receives an input signal at its source has a channel conductivity of a type opposite to that of the differential input MISFETs of the differential amplification stage. The differential amplifier has good frequency characteristics. Since the pair of cascode amplification stages make the currents taken from a pair of outputs from the differential amplification stage equal to each other, the operating balance of the differential amplification stage is not affected. The differential amplifier further includes a feedback circuit which detects the operating points of the cascode amplification stages by referring to the outputs of the cascode amplification stages, and generates a control voltage by comparing the detected operating points with a reference potential. The control voltage is fed back to the gates of the amplifying MISFETs in each cascode amplification stage. As a result, the operating point of each cascode amplification stage can be stabilized irrespective of variations in the characteristics of the MISFETs.

The differential amplifier in U.S. Pat. No. 4,538,114 further includes a bias circuit for applying a constant voltage to a MISFET in the differential input stage to make the MISFET operate as a constant-current source. The bias circuit also applies the constant voltage to MISFETs in the cascode stage to make them operate as constant-current sources. Thereby, the cascode stage is biased.

European patent application publication number 0446652 A1 corresponding to Japanese patent application publication number 4-220806 discloses a CMOS transconductance operational amplifier. The operational amplifier in European application 0446652 A1 includes a first differential stage, and a second single-ended stage driven by the first differential stage. The first differential stage is formed by two transistors which are biased by a current source and which have a load constituted by a current mirror. The current mirror is formed by two transistors with an MCAS cascode. The second single-ended stage is formed by a transistor which is biased by a current source. For frequency compensation, a first capacitor is connected between the source of the MCAS cascode of the first differential stage and the output node of the second single-ended stage, and a second capacitor is connected between the output node of the second single-ended stage and the input node of the second single-ended stage.

SUMMARY OF THE INVENTION

It is an object of this invention to provide an improved operational amplifier including a differential amplification circuit of a cascode connection type.

A first aspect of this invention provides an operational amplifier comprising a differential amplification circuit including load transistors arranged in a cascode connection; a voltage amplification circuit forming a stage following the differential amplification circuit; a capacitor coupling the differential amplification circuit and the voltage amplification circuit with each other; and a bias setting circuit for charging the capacitor to a prescribed bias voltage before amplification is started.

A second aspect of this invention is based on the first aspect thereof, and provides an operational amplifier wherein the charged capacitor sets the differential amplification circuit in a prescribed biased state.

A third aspect of this invention is based on the first aspect thereof, and provides an operational amplifier wherein the capacitor is interposed in a connection path between an output terminal of the differential amplification circuit and an input terminal of the voltage amplification circuit.

A fourth aspect of this invention is based on the third aspect thereof, and provides an operational amplifier wherein the capacitor includes first and second terminals connected to the output terminal of the differential amplification circuit and the input terminal of the voltage amplification circuit respectively.

A fifth aspect of this invention is based on the fourth aspect thereof, and provides an operational amplifier wherein the voltage amplification circuit includes a transistor having a gate connected with the input terminal of the voltage amplification circuit, and the bias setting circuit comprises a first switch circuit for applying a first bias setting voltage to the first terminal of the capacitor, and a second switch circuit for applying a second bias setting voltage to the second terminal of the capacitor.

A sixth aspect of this invention is based on the fifth aspect thereof, and provides an operational amplifier wherein the second switch circuit is connected between the second terminal of the capacitor and a drain of the transistor.

A seventh aspect of this invention is based on the fifth aspect thereof, and provides an operational amplifier wherein the bias setting circuit further comprises a third switch circuit connected between the output terminal of the differential amplification circuit and the first terminal of the capacitor.

An eighth aspect of this invention is based on the fourth aspect thereof, and provides an operational amplifier wherein the voltage amplification circuit includes a first transistor having a gate connected with the input terminal of the voltage amplification circuit, and a second transistor connected in series with the first transistor, and further comprising a second capacitor connected between a gate of the second transistor and one of the first and second terminals of the capacitor coupling the differential amplification circuit and the voltage amplification circuit with each other, and a second bias setting circuit for charging the second capacitor to a prescribed bias voltage before amplification is started.

A ninth aspect of this invention is based on the first aspect thereof, and provides an operational amplifier wherein the voltage amplification circuit has a plurality of input terminals and the differential amplification circuit has an output terminal, and the output terminal of the differential amplification circuit is connected with the input terminals of the voltage amplification circuit via a plurality of capacitors including the capacitor coupling the differential amplification circuit and the voltage amplification circuit with each other.

A tenth aspect of this invention provides an operational amplifier comprising a differential amplification circuit including load transistors arranged in a cascode connection; a voltage amplification circuit forming a stage following the differential amplification circuit; a capacitor coupling the differential amplification circuit and the voltage amplification circuit with each other; first means for charging the capacitor into a charged state during a first term; and second means for holding the capacitor in the charged state during a second term after the first term.

An eleventh aspect of this invention provides an operational amplifier comprising a differential amplification circuit including load transistors arranged in a cascode connection; a voltage amplification circuit forming a stage following the differential amplification circuit; first and second transistors included in the voltage amplification circuit and connected in series, the first transistor being of a first conductivity type, the second transistor being of a second conductivity type opposite to the first conductivity type; a first capacitor coupling the differential amplification circuit and the first transistor with each other; first means for charging the first capacitor into a charged state during a first term; second means for holding the first capacitor in the charged state during a second term after the first term; a second capacitor coupling the differential amplification circuit and the second transistor with each other; third means for charging the second capacitor into a charged state during the first term; and fourth means for holding the second capacitor in the charged state during the second term.

DETAILED DESCRIPTION OF THE INVENTION

A prior-art operational amplifier will be explained below for a better understanding of this invention.

Figure 1:
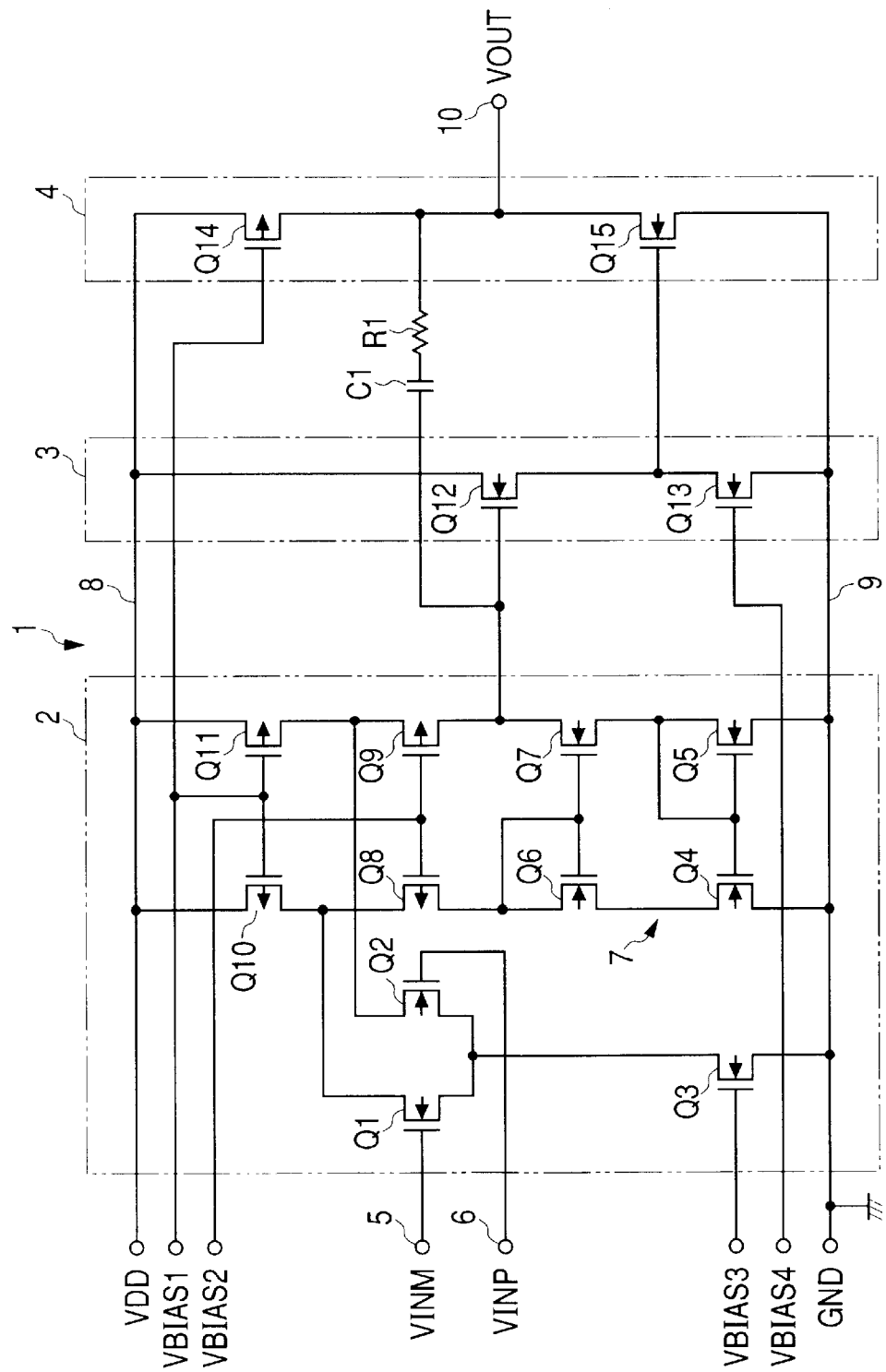
FIG. 1 is a schematic diagram of a prior-art operational amplifier.

FIG. 1 shows a prior-art operational amplifier 1 including a differential amplification circuit 2, a level shift circuit 3, and a voltage amplification circuit 4 which are sequentially connected in that order.

In the prior-art operational amplifier 1, the differential amplification circuit 2 is of a folded cascode type. The differential amplification circuit 2 includes MOS transistors Q1–Q11. The transistors Q1 and Q2 are connected with input terminals 5 and 6, respectively. The transistors Q1 and Q2 compose a differential pair. The transistors Q4–Q7 are arranged in a cascode connection forming an active load 7 on the differential pair of the transistors Q1 and Q2. The transistors Q8 and Q9 suppress the mirror effect provided by the transistors Q1 and Q2. The level shift circuit 3 includes a source follower circuit composed of the transistors Q12 and Q13 connected in series between power feed lines 8 and 9. The voltage amplification circuit 4 includes the transistors Q14 and Q15 which are connected in series between the power feed lines 8 and 9. The junction between the transistors Q14 and Q15 leads to an output terminal 10. One end of a series combination of a resistor R1 and a capacitor C1 is connected with the junction between the transistors Q14 and Q15 in the voltage amplification circuit 4. The other end of the series combination of the resistor R1 and the capacitor C1 is connected with the junction between the differential amplification circuit 2 and the level shift circuit 3. The series combination of the resistor R1 and the capacitor C1 provides phase compensation.

In general, the voltage gain of a differential amplification circuit is proportional to the impedance of an active load on a differential pair. A cascode connection of load transistors causes a high impedance of an active load. Since the differential amplification circuit 2 is of the folded cascode type, the voltage gain of the prior-art operational amplifier 1 is relatively high.

The voltage gain Av of the differential amplification circuit 2 is given by an equation as follows.

$$Av = -gm(Q1) \cdot Ro \qquad (1)$$

where gm(Q1) denotes the mutual conductance of the transistor Q1, and Ro denotes the output impedance of the differential amplification circuit 2. The output impedance Ro is given by an equation as follows.

$$Ro \approx 1 \bigg/ \left\{ \frac{gd(Q4)}{gm(Q7) \cdot rd(Q7)} + \frac{gd(Q2) + gd(Q11)}{gm(Q9) \cdot rd(Q9)} \right\} \quad (2)$$

where gd(Q4) denotes the drain conductance of the transistor Q4; gm(Q7) denotes the mutual conductance of the transistor Q7; rd(Q7) denotes the drain resistance of the transistor Q7; gd(Q2) denotes the drain conductance of the transistor Q2; gd(Q11) denotes the drain conductance of the transistor Q11; gm(Q9) denotes the mutual conductance of the transistor Q9, and rd(Q9) denotes the drain resistance of the transistor Q9.

The equations (1) and (2) teach that a high voltage gain Av requires a high output impedance Ro of the differential amplification circuit 2. In order to attain a high voltage gain Av, the transistor Q7 is required to operate in a biased state where the drain resistance rd(Q7) and the mutual conductance gm(Q7) thereof are great. Also, the transistor Q9 is required to operate in a biased state where the drain resistance rd(Q9) and the mutual conductance gm(Q9) thereof are great.

In general, a MOS transistor exhibits a great drain resistance and a high mutual conductance when operating in a saturation state.

It is assumed that the level shift circuit 3 is absent from the the prior-art operational amplifier 1. In this assumed amplifier structure, the drain of the transistor Q7 in the differential amplification circuit 2 is directly connected to the gate of the transistor Q15 in the voltage amplification circuit 4. A consideration will be given of whether or not the transistors Q7 and Q9 can be in saturation states in the assumed amplifier structure.

In general, when an N-channel MOS transistor operates in a saturation state, the voltage Vds between the drain and the source thereof, the voltage Vgs between the gate and the source thereof, and its gate threshold voltage Vt have the following relation.

$$Vds > Vgs - Vt \quad (3)$$

Therefore, in order to operate the transistor Q7 in a saturation state, the parameters Vds, Vgs, and Vt are required to have the following relation.

$$Vds(Q7) - Vgs(Q7) > -Vt \quad (4)$$

According to the relation of the transistor Q7 with the transistors Q5 and Q15, the following condition is satisfied.

$$Vds(Q7) - Vgs(Q7) = Vgs(Q15) - \{Vgs(Q7) + Vgs(Q5)\} \quad (5)$$

As understood from the relation (4) and the condition (5), in order to operate the transistor Q7 in a saturation state, it is necessary to satisfy the following condition.

$$Vgs(Q15) - \{Vgs(Q7) + Vgs(Q5)\} + Vt > 0 \quad (6)$$

When currents having similar values flow through the transistors Q5 and Q15, the voltages Vgs(Q5) and Vgs(Q15) are approximately equal to each other. Thus, it is difficult to satisfy the condition (6). Accordingly, in the assumed amplifier structure which lacks the level shift circuit 3, the transistor Q7 can not be operated in a state where the drain resistance rd(Q7) and the mutual conductance gm(Q7) thereof are great. Therefore, it is difficult to attain a high voltage gain Av.

On the other hand, the prior-art operational amplifier 1 which includes the level shift circuit 3 satisfies a condition expressed by the following equation.

$$Vds(Q7) - Vgs(Q7) = \{Vgs(Q12) + Vgs(Q15)\} - \{Vgs(Q7) + Vgs(Q5)\} \quad (7)$$

When currents having similar values flow through the transistors Q7, Q12, and Q15, the right-hand side of the equation is approximately equal to zero. Thus, it is possible to satisfy the relation (4). Accordingly, the transistor Q7 can be operated in a saturation state. Therefore, it is possible to attain a high voltage gain Av.

As understood from the previous explanation, in the prior-art operational amplifier 1, the level shift circuit 3 is indispensable for a high voltage gain Av.

The prior-art operational amplifier 1 has drawbacks as follows. In the prior-art operational amplifier 1, the differential amplification circuit 2 and the voltage amplification circuit 4 are connected via the level shift circuit 3 having the source follower circuit. The source follower circuit causes a pole in the open-loop characteristics of the prior-art operational amplifier 1 so that the phase delay is relatively great in a high-frequency region. Thus, when the prior-art operational amplifier 1 is used together with a feedback circuit, the amplifier stability drops and the amplifier 1 tends to oscillate.

In general, the level shift voltage provided by a source follower circuit is determined mainly by the gate threshold voltage of a transistor therein. The gate threshold voltage of a transistor is determined by a process of the manufacture thereof. Thus, in the prior-art operational amplifier 1, the level shift voltage provided by the level shift circuit 3 can not be set to a desired level in accordance with various factors including the form of the differential amplification circuit 2, the form of the voltage amplification circuit 4, the transistor size, the transistor characteristics, and the power supply voltage. Here, the desired level of the level shift voltage means one suited for a high voltage gain Av.

First Embodiment

Figure 2:
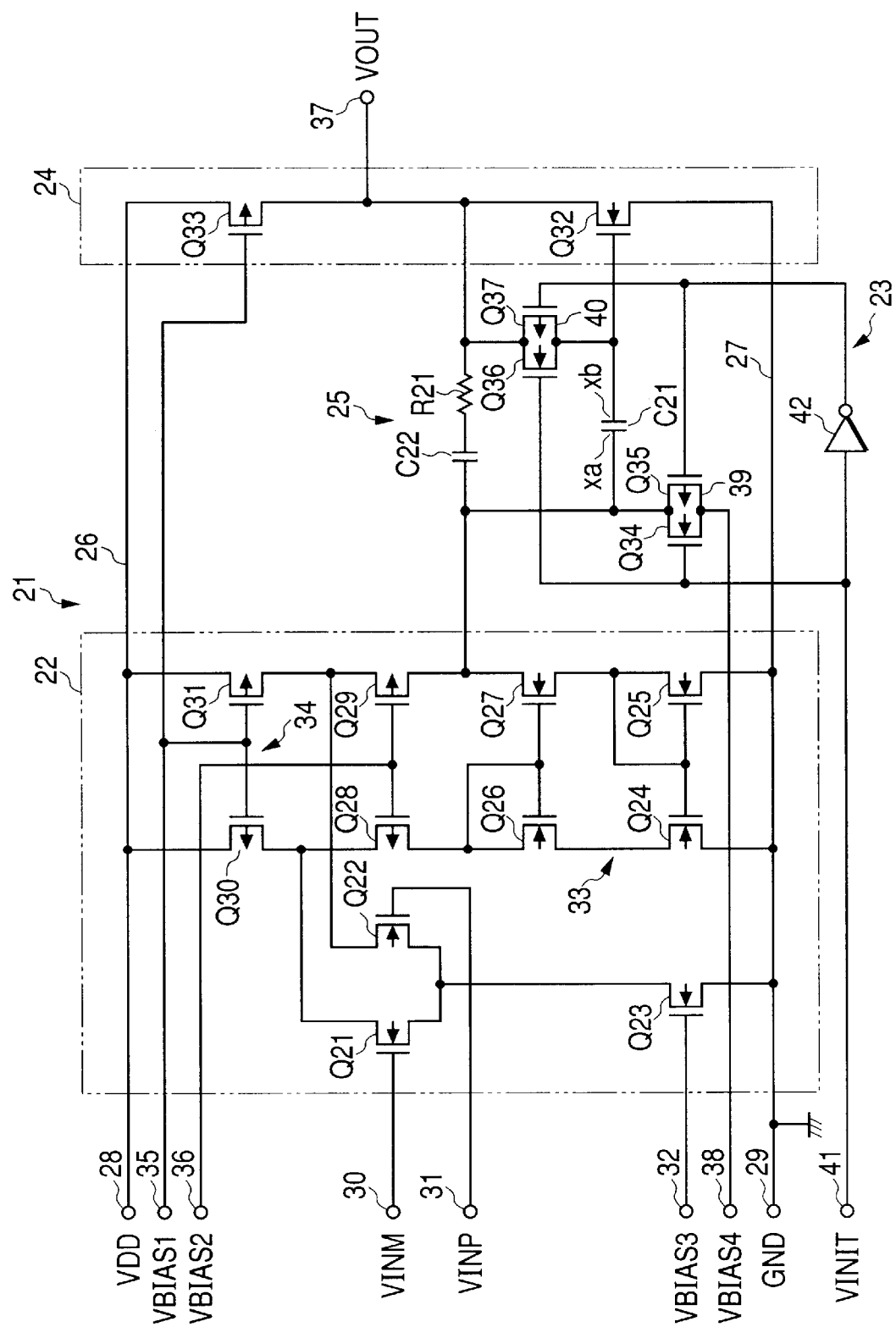
FIG. 2 is a schematic diagram of an operational amplifier according to a first embodiment of this invention.

FIG. 2 shows an operational amplifier 21 according to a first embodiment of this invention. The operational amplifier 21 is formed as a MOS-IC. As shown in FIG. 2, the operational amplifier 21 includes a differential amplification circuit 22, a bias setting circuit 23, a voltage amplification circuit 24, a phase compensation circuit 25, and a capacitor C21. Power feed lines 26 and 27 lead from power supply terminals 28 and 29, respectively. A constant power supply voltage VDD (for example, 5 V) is applied between the power feed lines 26 and 27 via the power supply terminals 28 and 29. The power feed line 26 constitutes a positive side while the power feed line 27 forms a negative side and is grounded.

The differential amplification circuit 22 is of a folded cascode connection type. The differential amplification circuit 22 includes MOS transistors Q21–Q31. The transistors Q21 and Q22 are of the N-channel type. The transistors Q21 and Q22 compose a differential pair. The sources of the transistors Q21 and Q22 are connected to each other to form a common source. The transistor Q23 which is of the N-channel type is connected between the power feed line 27 and the common source of the transistors Q21 and Q22. The transistor Q23 acts as a constant current circuit. The gate of the transistor Q21 is connected to an input terminal 30 for a negative input voltage (a minus input voltage) VINM. The gate of the transistor Q22 is connected to an input terminal 31 for a positive input voltage (a plus input voltage) VINP. The gate of the transistor Q23 is connected to an input terminal 32 for a bias setting voltage VBIAS3.

The transistors Q24 and Q25 are of the N-channel type. The transistors Q24 and Q25 make a pair. The transistors Q26 and Q27 are of the N-channel type. The transistors Q26 and Q27 make a pair. The transistors Q28 and Q29 are of the P-channel type. The transistors Q28 and Q29 make a pair. The transistors Q30 and Q31 are of the P-channel type. The transistors Q30 and Q31 make a pair. The transistors Q24, Q26, Q28, and Q30 are connected in series or tandem between the power feed lines 26 and 27. Similarly, the transistors Q25, Q27, Q29, and Q31 are connected in series or tandem between the power feed lines 26 and 27.

The transistors Q24–Q27 are arranged in a cascode connection forming an active load 33 on the differential pair of the transistors Q21 and Q22. The transistors Q24–Q27 correspond to load transistors.

The transistors Q30 and Q31 form a constant current circuit 34 which folds the output currents from the differential pair of the transistors Q21 and Q22 to direct them into the active load 33. The gates of the transistors Q30 and Q31 are connected in common to a line (a common gate line) leading from an input terminal 35. The common gate line is subjected via the input terminal 35 to a bias setting voltage VBIAS1. Therefore, the gates of the transistors Q30 and Q31 are subjected to the bias setting voltage VBIAS1.

The pair of the transistors Q28 and Q29 is connected between the active load 33 and the constant current circuit 34. The transistors Q28 and Q29 suppress the occurrence of the mirror effect in the transistors Q21 and Q22. The source of the transistor Q28 is connected with the drains of the transistors Q21 and Q30. The source of the transistor Q29 is connected with the drains of the transistors Q22 and Q31. The gates of the transistors Q28 and Q29 are connected in common to a line (a common gate line) leading from an input terminal 36. The common gate line is subjected via the input terminal 36 to a bias setting voltage VBIAS2. Therefore, the gates of the transistors Q28 and Q29 are subjected to the bias setting voltage VBIAS2.

The drains of the transistors Q27 and Q29 are connected with each other. The junction between the drains of the transistors Q27 and Q29 corresponds to an output terminal of the differential amplification circuit 22.

The voltage amplification circuit 24 includes an N-channel MOS transistor Q32 and a P-channel MOS transistor Q33. The transistors Q32 and Q33 are connected in series between the power feed lines 26 and 27. The drains of the transistors Q32 and Q33 are connected to each other, forming a common drain. The common drain of the transistors Q32 and Q33 leads to an amplifier output terminal 37 at which an amplifier output voltage VOUT appears. The gate of the transistor Q33 is subjected to the bias setting voltage VBIAS1 so that the transistor Q33 acts as a constant current circuit. The gate of the transistor Q32 corresponds to an input terminal of the voltage amplification circuit 24.

A capacitor C21 is connected between the output terminal of the differential amplification circuit 22 and the input terminal of the voltage amplification circuit 24. The capacitor C21 has a first terminal "xa" connected to the differential amplification circuit 22, and a second terminal "xb" connected to the voltage amplification circuit 24.

An analog switch 39 is connected between an input terminal 38 and the terminal "xa" of the capacitor C21. An analog switch 40 is connected between the terminal "xb" of the capacitor C21 and the common drain of the transistors Q32 and Q33. The switch 39 includes a parallel combination of an N-channel MOS transistor Q34 and a P-channel MOS transistor Q35. The switch 40 includes a parallel combination of an N-channel MOS transistor Q36 and a P-channel MOS transistor Q37.

A bias setting voltage VBIAS4 is applied to the input terminal 38 from an external. A control signal VINIT is applied to an input terminal 41 from an external control circuit (not shown). The control signal VINIT is in either a high level state or a low level state. The input terminal 41 is directly connected to the gates of the transistors Q34 and Q36. The input terminal 41 is connected via an inverter circuit 42 to the gates of the transistors Q35 and Q37. The switches 39 and 40, and the inverter circuit 42 compose the bias setting circuit 23.

A series combination of a capacitor C22 and a resistor R21 is connected between the amplifier output terminal 37 and the output terminal of the differential amplification circuit 22. The series combination of the capacitor 22 and the resistor R21 forms the phase compensation circuit 25.

The operational amplifier 21 can be used as a preamplifier for a track hold circuit. In this case, the operational amplifier 21 operates as follows.

Operation of the operational amplifier 21 can be changed between a normal amplification mode and a bias setting mode. When the control signal VINIT is in its low level state, the operational amplifier 21 operates in the normal amplification mode.

On the other hand, when the control signal VINIT is in its high level state, the operational amplifier 21 operates in the bias setting mode.

When the control signal VINIT changes from its low level state to its high level state, the switches 39 and 40 assume their on states. As a result, the bias setting voltage VBIAS4 is applied to the terminal "xa" of the capacitor C21 via the switch 39. On the other hand, the switch 40 establishes the connection of the terminal "xb" of the capacitor C21 with the drains of the transistors Q32 and Q33. It should be noted that the terminal "xb" of the capacitor C21 is directly connected to the gate of the transistor Q32, and the drains of the transistors Q32 and Q33 lead to the amplifier output terminal 37. In the absence of a current inputted or outputted via the output terminal 37, all the current which flows out of the transistor Q33 constitutes a drain current through the transistor Q32. Therefore, the drain voltage of the transistor Q32 (the amplifier output voltage VOUT), that is, the voltage at the terminal "xb" of the capacitor C21, is determined by the drain current through the transistor Q32. Thus, a specific bias voltage equal to a prescribed level is applied between the terminals "xa" and "xb" of the capacitor C21 as a charging time interval $\Delta t1$ is spent until the capacitor C21 is fully charged by the specific bias voltage.

After the capacitor C21 is fully charged, the control signal VINIT is changed from its high level state to its low level state. In this case, the normal amplification mode of operation of the operational amplifier 21 is started. When the control signal VINIT is changed from its high level state to its low level state, the switches 39 and 40 assume their off states. Therefore, the junction between the terminal "xb" of the capacitor C21 and the gate of the transistor Q32 falls into a high-impedance state, and the charges continue to be stored in the capacitor C21. Accordingly, the voltage between the terminals "xa" and "xb" of the capacitor C21 is held at a value equal to the specific bias voltage, that is, the voltage occurring immediately before the change of the control signal VINIT to its low level state. In the case where a current inputted or outputted via the amplifier output terminal 37 is absent, since a current flowing out of the transistor Q33 is always constant, the gate voltage of the transistor Q32 is equal to that occurring when the control signal VINIT is in its high level state.

Thus, even after the control signal VINIT is changed to its low level state so that the operational amplifier 21 starts operating in the normal amplification mode, the voltage at the terminal "xa" of the capacitor C21 (that is, the drain voltage of the transistor Q27) is held equal to the bias setting voltage VBIAS4. Therefore, the capacitor C21 acts as a level shift circuit which couples the output terminal of the differential amplification circuit 22 with the input terminal of the voltage amplification circuit 24 while providing a level shift corresponding to the previously-indicated specific bias voltage. Accordingly, not only an alternating-current signal but also a direct-current signal can be transmitted from the differential amplification circuit 22 to the voltage amplification circuit 24.

Preferably, the differential amplification circuit 22 is operated in a properly biased state where the operational amplifier 21 has a high voltage gain (a high open-loop gain) Av. Preferably, the transistors Q27 and Q29 are operated in their saturation state where the drain resistances and the mutual conductances thereof are great. The great drain resistances and the great mutual conductances result in a high output impedance Ro of the differential amplification circuit 22 which provides a high voltage gain Av.

During the operation of the operational amplifier 21 in the normal amplification mode, the drain voltage of the transistor Q27 and the gate voltage of the transistor Q29 can be arbitrarily set in response to the bias setting voltages VBIAS4 and VBIAS2 respectively. In order to operate the transistors Q27 and Q29 in their saturation states, the bias setting voltages VBIAS4 and VBIAS2 are chosen to satisfy conditions as follows.

$$VBIAS4 > \{Vgs(Q27) + Vgs(Q25)\} - VtN \quad (8)$$

$$VBIAS2 > VBIAS4 - |VtP| \quad (9)$$

where Vgs(Q27) denotes the voltage between the gate and the source of the transistor Q27; Vgs(Q25) denotes the voltage between the gate and the source of the transistor Q25; VtN denotes the gate threshold voltage of a N-channel MOS transistor; and VtP denotes the gate threshold voltage of a P-channel MOS transistor.

Each of the bias setting voltages VBIAS4 and VBIAS2 can be generated by dividing the power supply voltage VDD. Usually, dividing the power supply voltage VDD is implemented by a combination of resistors. When the power supply voltage VDD is 5 V, it is preferable that the bias setting voltage VBIAS4 equals VDD/2 (2.5 V).

After the control signal VINIT is changed to its low level state so that the switches 39 and 40 assume their off states, the charges continue to be stored in the capacitor C21. In fact, the capacitor C21 is discharged at a very small rate via a current leak paths including the switch 40 and the gate of the transistor Q32. In order to compensate for the discharging of the capacitor C21, it is preferable to repetitively execute the bias setting mode of operation of the operational amplifier 1 at a prescribed period.

Figure 3:
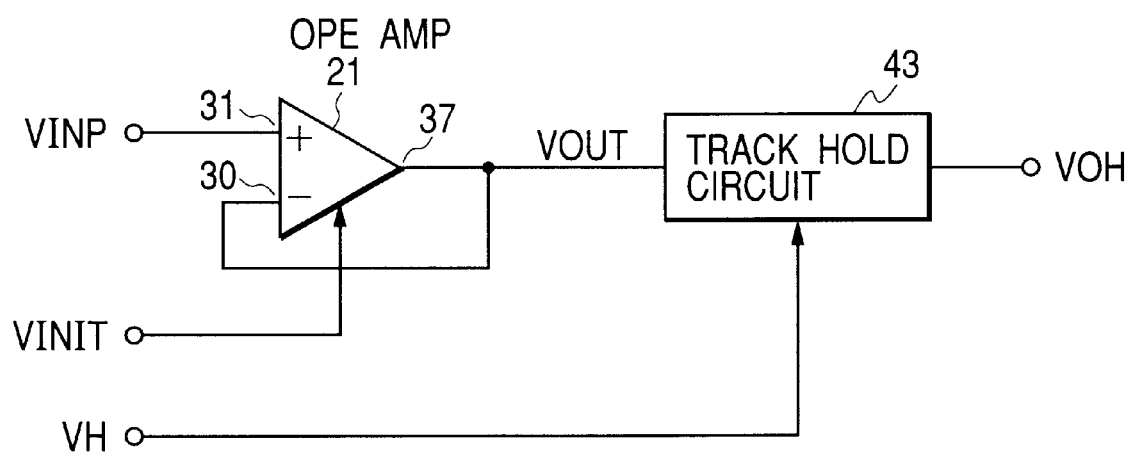
FIG. 3 is a block diagram of a track hold circuit and the operational amplifier in the first embodiment of this invention.

With reference to FIG. 3, the operational amplifier 21 is connected with a track hold circuit 43. The operational amplifier 21 has a circuit structure as a voltage follower. The input terminal (the non-inverting input terminal) 31 of the operational amplifier 21 receives the input voltage VINP. The input terminal (the inverting input terminal) 30 of the operational amplifier 21 is connected with the output terminal 37 thereof. The operational amplifier 21 receives the control signal VINIT from the control circuit (not shown). The output terminal 37 of the operational amplifier 21 is connected with the input terminal of the track hold circuit 43. Thus, the output voltage VOUT from the operational amplifier 21 is applied to the input terminal of the track hold circuit 43. The track hold circuit 43 receives a control signal VH from the control circuit (not shown). When the control signal VH is in a low level state, the track hold circuit 43 transmits the amplifier output voltage VOUT to a subsequent stage. Thus, in this case, the track hold circuit 43 implements a tracking action. When the control signal VH changes from its low level state to its high level state, the track hold circuit 43 samples the amplifier output voltage VOUT. During a time interval for which the control signal VH remains in its high level state, the track hold circuit 43 holds the sampled amplifier output voltage VOUT. In FIG. 3, the voltage outputted from the track hold circuit 43 is denoted by VOH.

Figure 4:
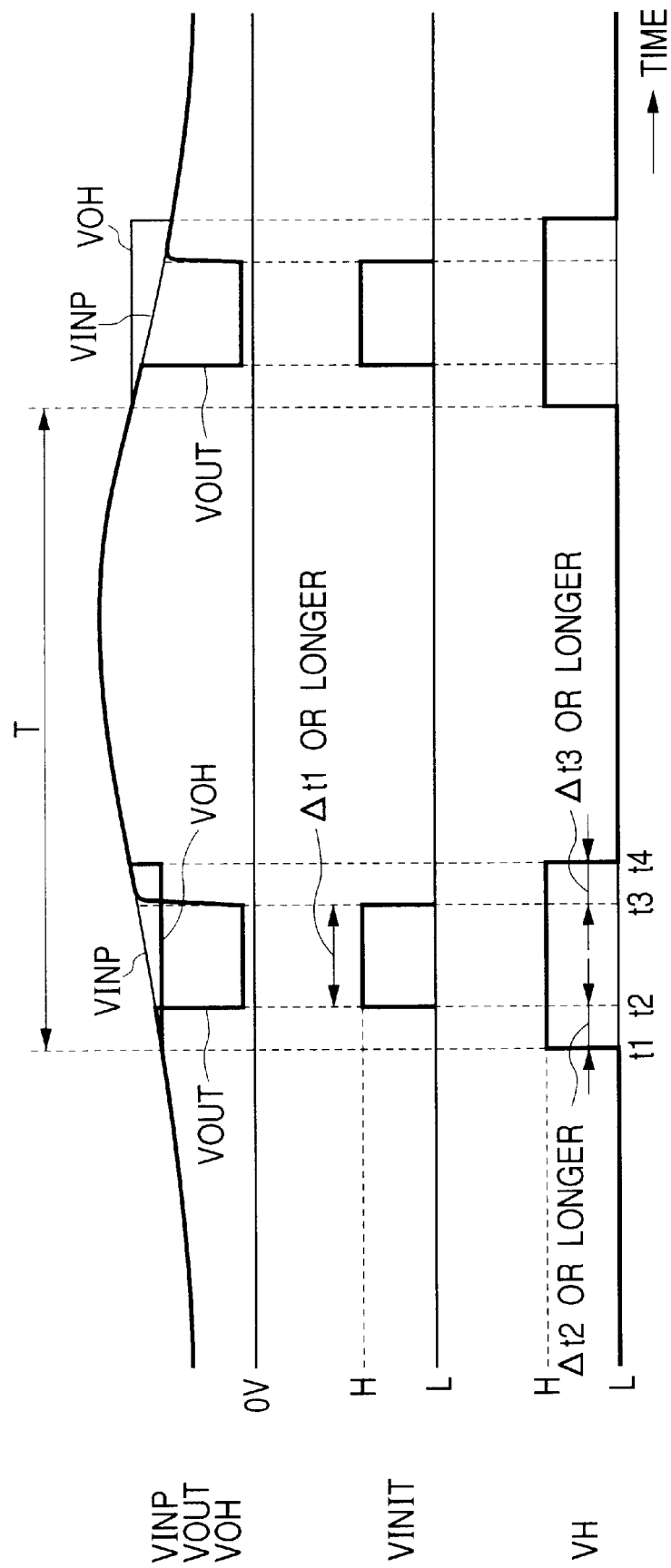
FIG. 4 is a time-domain diagram of signals in FIG. 3.

With reference to FIG. 4, the control signal VH for the track hold circuit 43 repetitively assumes its high level state at a period T. The control signal VINIT for the operational amplifier 21 is synchronous with the control signal VH for the track hold circuit 43. During every time interval for which the control signal VH is in its high level state, the control signal VH changes from its low level state to its high level state and then returns to its low level state. The period T is preset to a value shorter than a desired longest period at which the bias setting mode of operation of the operational amplifier 21 is repetitively executed.

In FIG. 4, at a moment t1, the control signal VH for the track hold circuit 43 changes from its low level state to its high level state so that the track hold circuit 43 samples the amplifier output voltage VOUT. Then, the track hold circuit 43 holds the sampled amplifier output voltage VOUT. At a moment t2 which follows the moment t1 by a predetermined time interval Δt2 or longer, the control signal VINIT for the operational amplifier 21 changes from its low level state to its high level state. Therefore, the operation of the operational amplifier 21 changes from the normal amplification mode to the bias setting mode. The predetermined time interval Δt2 is equal to a value taken by the track hold circuit 43 to sample the amplifier output voltage VOUT. During the operation of the operational amplifier 21 in the bias setting mode, the amplifier output voltage VOUT is equal to a value (the voltage between the gate and the source of the transistor Q32) independent of the input voltage VINP. At the moment t2, the track hold circuit 43 is executing the holding action, and hence the amplifier output voltage VOUT which is caused by the bias setting mode of operation of the operational amplifier 21 does not affect the output voltage VOH from the track hold circuit 43.

At a moment t3 which follows the moment t2 by the previously-indicated charging time interval Δt1 or longer, the control signal VINIT for the operational amplifier 21 changes from its high level state to its low level state. Therefore, the operation of the operational amplifier 21 returns from the bias setting mode to the normal amplification mode. At a moment t4 which follows the moment t3 by a predetermined time interval Δt3 or longer, the control signal VH for the track hold circuit 43 returns from its high level state to its low level state. Therefore, the track hold circuit 43 starts transmitting the amplifier output voltage VOUT to the subsequent stage. The predetermined time interval Δt3 is equal to a value taken by the operational amplifier 21 to retrieve the normal amplification mode of operation.

The bias setting mode of operation of the operational amplifier 21 causes the capacitor C21 to be charged to a degree corresponding to the previously-indicated specific bias voltage. At and after the moment t4 when the track hold circuit 43 starts the tracking action (the voltage-transmitting action), the operational amplifier 21 successfully operates in the normal amplification mode. As understood from the previous explanation, the bias setting mode of operation is executed by use of every time interval for which the track hold circuit 43 implements the holding action.

As previously mentioned, the operational amplifier 21 includes the differential amplification circuit 22, the bias setting circuit 23, the voltage amplification circuit 24, and the capacitor C21. The differential amplification circuit 22 is of the folded cascode connection type. The capacitor C21 couples the output terminal of the differential amplification circuit 22 and the input terminal of the voltage amplification circuit 24. The bias setting circuit 23 acts to charge the capacitor C21 to the degree corresponding to the specific bias voltage. The biased condition of the connection between the differential amplification circuit 22 and the voltage amplification circuit 24 can be arbitrarily set in accordance with the specific bias voltage without using a source-follower transistor circuit as a level shift circuit.

The transistors Q27 and Q29 are operated in their saturation states. Therefore, it is possible to attain a high amplifier voltage gain Av. The biases to the transistors Q27 and Q29 can be finely adjusted to increase the drain resistances and the mutual conductances thereof. Thus, it is possible to further increase the amplifier voltage gain Av.

Since the operational amplifier 21 dispenses with a source-follower transistor circuit serving as a level shift circuit, a pole is prevented from occurring in the connection between the differential amplification circuit 22 and the voltage amplification circuit 24. Therefore, the operational amplifier 21 has a high stability.

Second Embodiment

Figure 5:
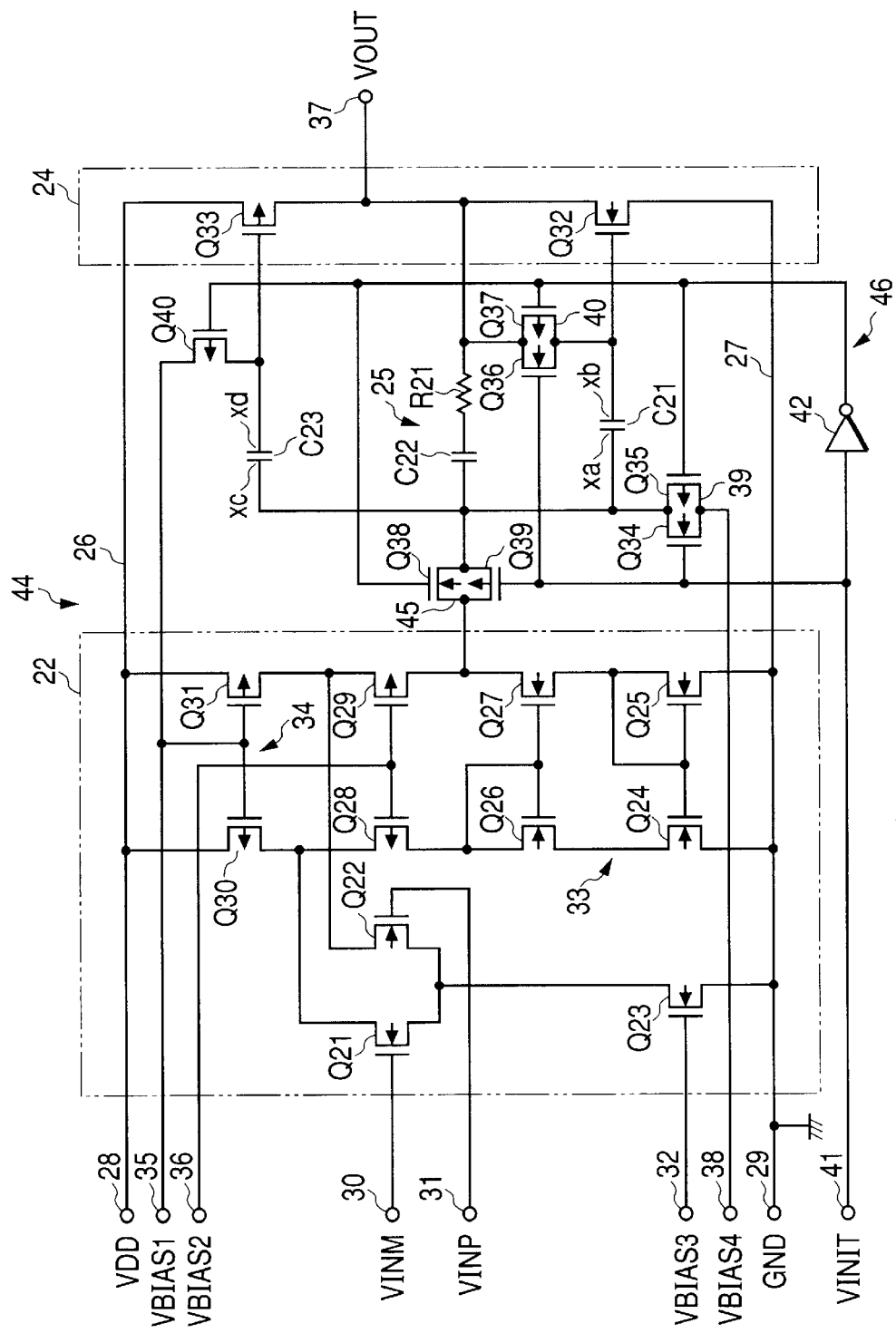
FIG. 5 is a schematic diagram of an operational amplifier according to a second embodiment of this invention.

FIG. 5 shows an operational amplifier 44 according to a second embodiment of this invention. The operational amplifier 44 is similar to the operational amplifier 21 (see FIG. 2) except for design changes mentioned hereafter.

As shown in FIG. 4, the operational amplifier 44 includes an analog switch 45 connected between the drain of the transistor Q27 (the output terminal of the differential amplification circuit 22) and the terminal "xa" of the capacitor C21. The switch 45 is also connected between the output terminal of the differential amplification circuit 22 and the phase compensation circuit 25. The switch 45 includes a parallel combination of an N-channel MOS transistor Q38 and a P-channel MOS transistor Q39. The gate of the transistor Q38 is connected with the output terminal of the inverter circuit 42. The gate of the transistor Q39 is connected with the input terminal 41. The switches 39, 40, and 45, and the inverter circuit 42 compose a bias setting circuit 46.

A capacitor C23 is connected between the gate of the transistor Q33 and the terminal "xa" of the capacitor C21. The capacitor C23 has a first terminal "xc" connected to the terminal "xa" of the capacitor C21, and a second terminal "xd" connected to the gate of the transistor Q33. The source-drain path of a P-channel MOS transistor Q40 is connected between the input terminal 35 and the gate of the transistor Q33. The gate of the transistor Q40 is connected to the output terminal of the inverter circuit 42. The gates of the transistors Q32 and Q33 correspond to the input terminals of the voltage amplification circuit 24. The transistor Q32 forms a lower-side portion of the voltage amplification circuit 24 while the transistor Q33 forms an upper-side portion thereof.

When the control signal VINIT changes from its low level state to its high level state, the switches 39 and 40 and the transistor Q40 assume their on states and the switch 45 assumes its off state. Therefore, the operational amplifier 44 operates in the bias setting mode. During the bias setting mode of operation, the switch 45 uncouples the capacitor C21 and the switch 39 from the output terminal of the differential amplification circuit 22, thereby blocking a current from the output terminal of the differential amplification circuit 22 toward the capacitor C21 and the switch 39 which would cause an error in the bias voltage with respect to the capacitor C21. In other words, the switch 45 prevents an error from occurring in the bias voltage with respect to the capacitor C21.

During the bias setting mode of operation, the bias setting voltage VBIAS4 is applied to the terminal "xc" of the capacitor C23 via the switch 39 while the bias voltage VBIAS1 is applied to the terminal "xd" of the capacitor C23 and the gate of the transistor Q33 via the transistor Q40. Thus, a specific bias voltage equal to a prescribed level is applied between the terminals "xc" and "xd" of the capacitor C23 as a charging voltage. Accordingly, the capacitor C23 is charged. During the bias setting mode of operation, a constant drain current determined by the bias setting voltage VBIAS1 flows through the transistor Q33.

After the capacitors C21 and C23 are fully charged, the control signal VINIT changes from its high level state to its low level state so that the switches 39 and 40 and the transistor Q40 assume their off states and the switch 45 assumes its on state. Therefore, the operational amplifier 44 operates in the normal amplification mode. In this case, the junction between the terminal "xd" of the capacitor C23 and the gate of the transistor Q33 falls into a high-impedance state, and the charges continue to be stored in the capacitor C23.

During the normal amplification mode of operation, the drain voltage of the transistor Q27 is determined by the bias setting voltage VBIAS4, and the gate voltage of the transistor Q33 is determined by the bias setting voltage VBIAS1. In addition, the gate voltage of the transistor Q32 is determined by the drain current flowing through the transistor Q33. Preferably, the bias setting voltage VBIAS1 is equal to a level corresponding to desired currents through the transistors Q32 and Q33 which depend on a load connected to the amplifier output terminal 37.

During the normal amplification mode of operation, the differential amplification circuit 22 outputs a voltage depending on the input voltages VINP and VINM. The output voltage from the differential amplification circuit 22 is transmitted via the capacitor C21 to the N-channel transistor Q32 which forms the lower-side portion of the voltage amplification circuit 24. At the same time, the output voltage from the differential amplification circuit 22 is transmitted via the capacitor C23 to the P-channel transistor Q33 which forms the upper-side portion of the voltage amplification circuit 24. In other words, the gates of the transistors Q32 and Q33 of the conduction types different from each other are coupled via the capacitors C21 and C23, and are driven by the common voltage (the output voltage from the differential amplification circuit 22). Therefore, the transistors Q32 and Q33 complementarily operate in response to the output voltage from the differential amplification circuit 22. As a result, the output impedance of the lower-side portion of the voltage amplification circuit 24 and the output impedance of the upper-side portion thereof balance each other, and high throughput rates in the rising and falling directions are provided.

As previously mentioned, the operational amplifier 44 includes the switch 45. During the bias setting mode of operation, the switch 45 enables the voltage at the terminal "xa" of the capacitor C21 to be accurately set to the bias setting voltage VBIAS4. Therefore, an error is prevented from occurring in the bias voltage with respect to the capacitor C21.

Third Embodiment

Figure 6:
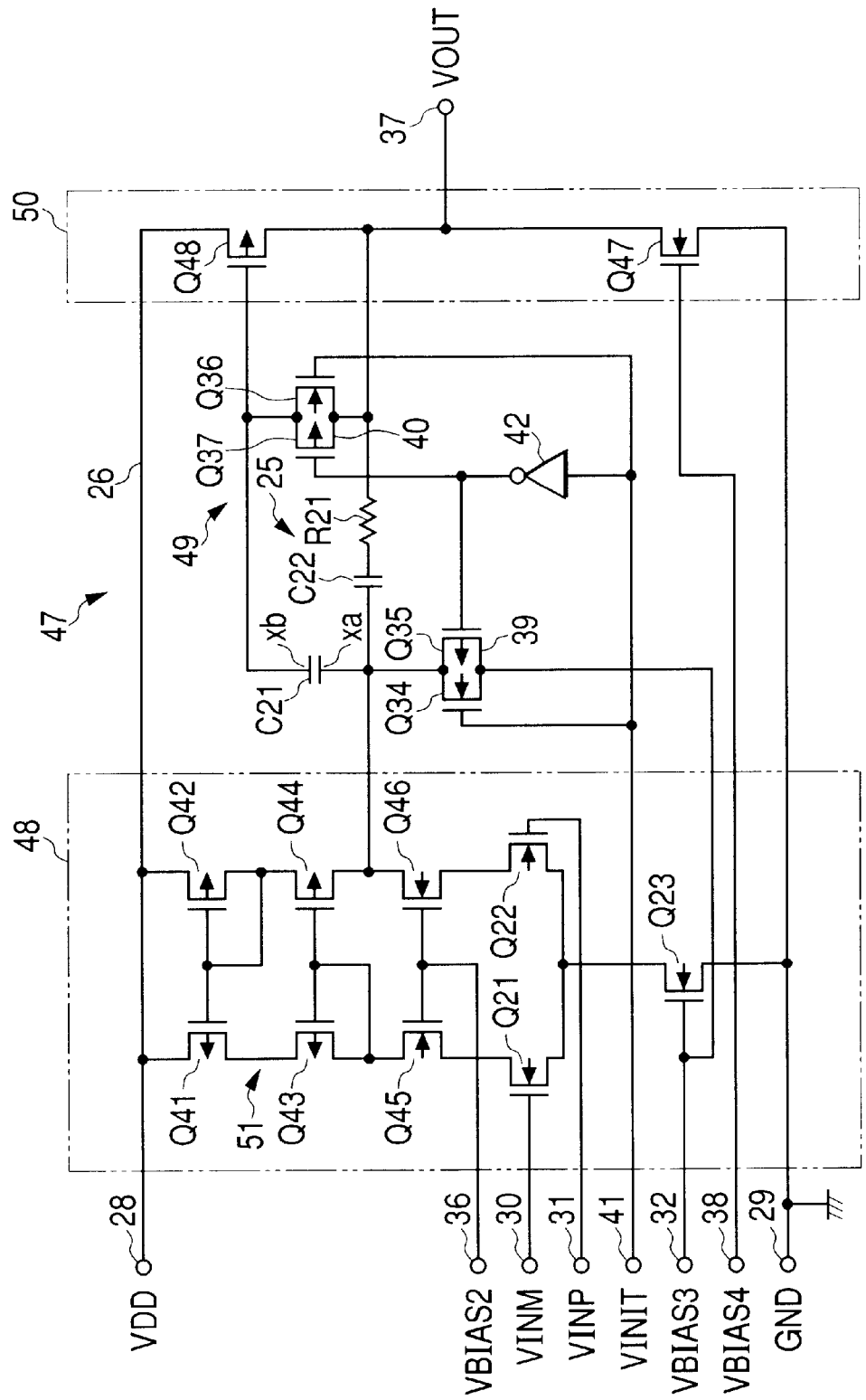
FIG. 6 is a schematic diagram of an operational amplifier according to a third embodiment of this invention.

FIG. 6 shows an operational amplifier 47 according to a third embodiment of this invention. The operational amplifier 47 is similar to the operational amplifier 21 (see FIG. 2) except for design changes mentioned hereafter.

As shown in FIG. 6, the operational amplifier 47 includes a differential amplification circuit 48, a bias setting circuit 49, and a voltage amplification circuit 50 instead of the differential amplification circuit 22, the bias setting circuit 23, and the voltage amplification circuit 24 (see FIG. 2) respectively. The operational amplifier 47 further includes a capacitor C21 and a phase compensation circuit 25 similar to those in FIG. 2.

The differential amplification circuit 48 is of a cascode connection type without a fold. The differential amplification circuit 48 includes MOS transistors Q21–Q23 and Q41–Q46. The transistors Q21–Q23 are similar to those in FIG. 2. The transistors Q45 and Q46 are of the N-channel type. The transistors Q45 and Q46 make a pair. The transistors Q43 and Q44 are of the P-channel type. The transistors Q43 and Q44 make a pair. The transistors Q41 and Q42 are of the P-channel type. The transistors Q41 and Q42 make a pair. The transistors Q41, Q43, and Q45 are connected in series or tandem between the power feed line 26 and the transistor Q21 in the differential pair. Similarly, the transistors Q42, Q44, and Q46 are connected in series or tandem between the power feed line 26 and the transistor Q22 in the differential pair. The transistors Q41–Q44 are arranged in a cascode connection forming an active load 51 on the differential pair of the transistors Q21 and Q22. The transistors Q41–Q44 correspond to load transistors.

The gates of the transistors Q45 and Q46 are connected in common to a line (a common gate line) leading from an input terminal 36. The common gate line is subjected via the input terminal 36 to a bias setting voltage VBIAS2. Therefore, the gates of the transistors Q45 and Q46 are subjected to the bias setting voltage VBIAS2. The drains of the transistors Q44 and Q46 are connected with each other. The junction between the drains of the transistors Q44 and Q46 corresponds to an output terminal of the differential amplification circuit 48.

The voltage amplification circuit 50 includes an N-channel MOS transistor Q47 and a P-channel MOS transistor Q48. The transistors Q47 and Q48 are connected in series between the power feed lines 26 and 27. The drains of the transistors Q47 and Q48 are connected to each other, forming a common drain. The common drain of the transistors Q47 and Q48 leads to an amplifier output terminal 37 at which an amplifier output voltage VOUT appears. The gate of the transistor Q47 is subjected to a bias setting voltage VBIAS3 so that the transistor Q47 acts as a constant current circuit. The gate of the transistor Q48 corresponds to an input terminal of the voltage amplification circuit 50.

The capacitor C21 is connected between the output terminal of the differential amplification circuit 48 and the input terminal of the voltage amplification circuit 50. The capacitor C21 has a first terminal "xa" connected to the differential amplification circuit 48, and a second terminal "xb" connected to the voltage amplification circuit 50. There is an analog switch 39 similar to that in FIG. 2. An analog switch 40 is connected between the terminal "xb" of the capacitor C21 and the common drain of the transistors Q47 and Q48. The switches 39 and 40, and an inverter circuit 42 compose the bias setting circuit 49.

Operation of the operational amplifier 47 can be changed between a normal amplification mode and a bias setting mode in response to a control signal VINIT fed thereto. Preferably, the bias setting voltages VBIAS2 and VBIAS4 are chosen to operate the transistors Q44 and Q46 in their saturation states. In this case, the operational amplifier 47 has a high voltage gain Av.

Fourth Embodiment

A fourth embodiment of this invention is a modification of the first embodiment thereof (see FIG. 2). In the fourth embodiment of this invention, a switch circuit similar to the analog switch 45 in FIG. 5 is provided between the drain of the transistor Q27 (the output terminal of the differential amplification circuit 22) and the terminal "xa" of the capacitor C21.

Fifth Embodiment

A fifth embodiment of this invention is a modification of the third embodiment thereof (see FIG. 6). In the fifth embodiment of this invention, a switch circuit similar to the analog switch 45 in FIG. 5 is provided between the drain of the transistor Q44 (the output terminal of the differential amplification circuit 48) and the terminal "xa" of the capacitor C21.

Sixth Embodiment

A sixth embodiment of this invention is a modification of the second embodiment thereof (see FIG. 5). In the sixth embodiment of this invention, the capacitor C23 is moved to a position between the gate of the transistor Q33 and the terminal "xb" of the capacitor C21.

Seventh Embodiment

A seventh embodiment of this invention is a modification of the second embodiment thereof (see FIG. 5). The switch 45 is omitted from the seventh embodiment of this invention. Thus, in the seventh embodiment of this invention, the terminal "xa" of the capacitor C21 is directly connected to the output terminal of the differential amplification circuit 22.

Eighth Embodiment

An eighth embodiment of this invention is a modification of the second embodiment thereof (see FIG. 5). The eighth embodiment of this invention includes an analog switch instead of the transistor Q40.

Ninth Embodiment

A ninth embodiment of this invention is a modification of the third embodiment thereof (see FIG. 6). In the ninth embodiment of this invention, a capacitor is provided between the gate of the transistor Q47 and the terminal "xa" or "xb" of the capacitor C21, and a transistor or an analog switch is provided between the input terminal 32 and the gate of the transistor Q47.

Tenth Embodiment

A tenth embodiment of this invention is a modification of one of the first to ninth embodiments thereof. The tenth embodiment of this invention includes a multi-input voltage amplification circuit instead of the voltage amplification circuit 24 or 50. In the tenth embodiment of this invention, the output terminal of the differential amplification circuit 22 or 48 is coupled with the input terminals of the voltage amplification circuit via capacitors.

Eleventh Embodiment

An eleventh embodiment of this invention is a modification of one of the first to tenth embodiments thereof. In the eleventh embodiment of this invention, the switch 40 is connected between a bias setting terminal and the terminal "xb" of the capacitor C21. During the bias setting mode of operation, a given bias setting voltage is applied to the terminal "xb" of the capacitor C21.

Twelfth Embodiment

A twelfth embodiment of this invention is a modification of one of the first to eleventh embodiments thereof. In the twelfth embodiment of this invention, the differential amplification circuit 22 or 48 is designed to have three or more stages of cascode connections.

Thirteenth Embodiment

A thirteenth embodiment of this invention is a modification of one of the first to twelfth embodiments thereof. In the thirteenth embodiment of this invention, the operational amplifier 21, 44, or 47 is used for one of a switched capacitor filter, an A/D converter, and a D/A converter rather than a track hold circuit.

Fourteenth Embodiment

Figure 7:
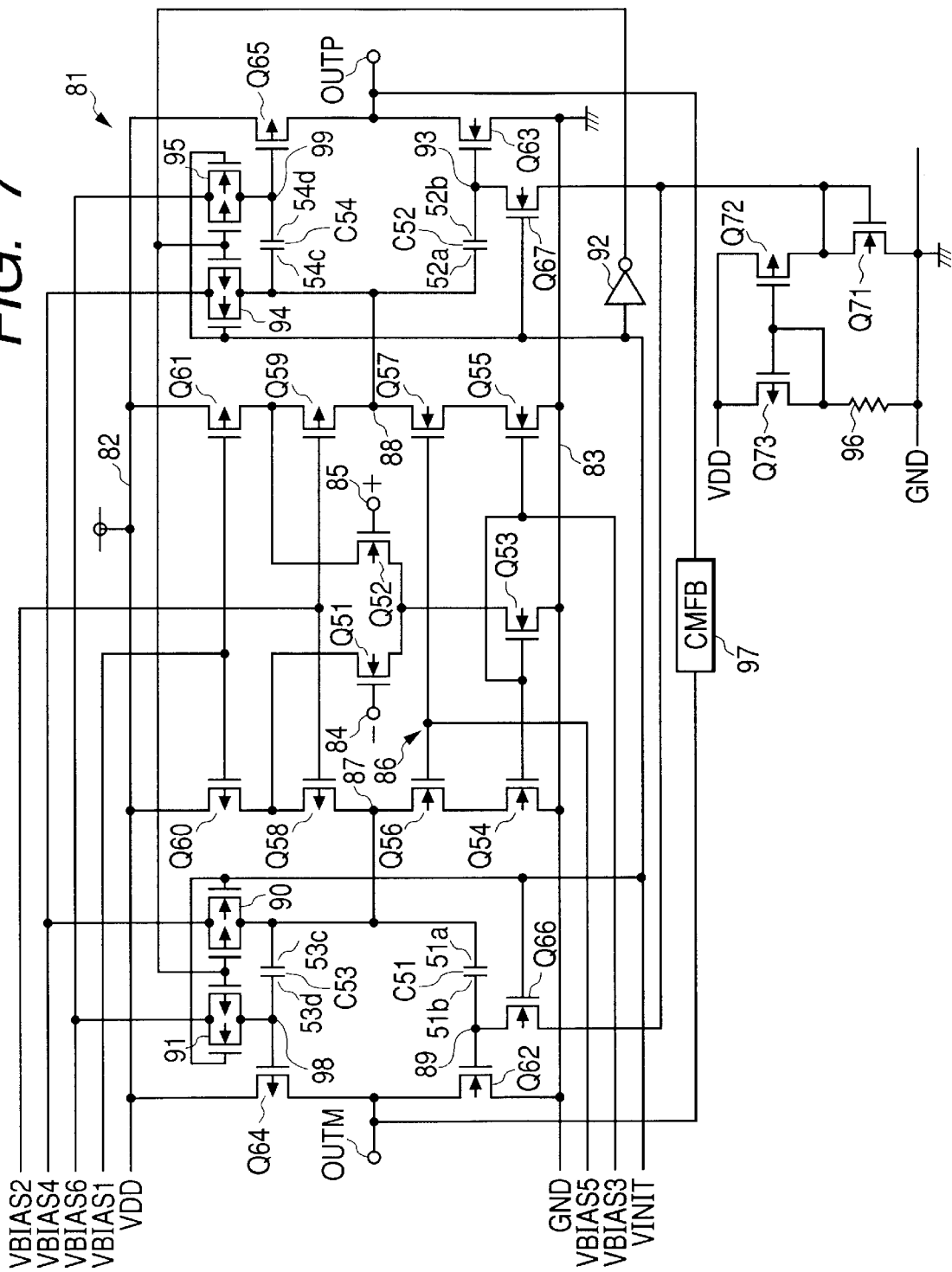
FIG. 7 is a schematic diagram of an operational amplifier according to a fourteenth embodiment of this invention.

FIG. 7 shows an operational amplifier 81 according to a fourteenth embodiment of this invention. The operational amplifier 81 is formed as a MOS-IC. The operational amplifier 81 includes a positive side and a negative side (a plus side and a minus side) which are symmetrical.

As shown in FIG. 7, the operational amplifier 81 includes a pair of a positive power feed line 82 and a negative power feed line 83. A constant power supply voltage VDD (for example, 5 V) is applied between the power feed lines 82 and 83. The negative power feed line 83 is grounded.

The operational amplifier 81 includes MOS transistors Q51–Q61 composing a differential amplification circuit of a folded cascode connection type. The transistors Q51 and Q52 are of the N-channel type. The transistors Q51 and Q52 compose a differential pair. The sources of the transistors Q51 and Q52 are connected to each other to form a common source. The gate of the transistor Q51 is connected to an input terminal 84 for a negative input voltage (a minus input voltage). The gate of the transistor Q52 is connected to an input terminal 85 for a positive input voltage (a plus input voltage). The transistor Q53 which is of the N-channel type is connected between the power feed line 83 and the common source of the transistors Q51 and Q52. The gate of the transistor Q53 is subjected to a bias setting voltage VBIAS3. The transistor Q53 acts as a constant current circuit.

The transistors Q54 and Q55 are of the N-channel type. The transistors Q54 and Q55 make a pair. The transistors Q56 and Q57 are of the N-channel type. The transistors Q56 and Q57 make a pair. The transistors Q58 and Q59 are of the P-channel type. The transistors Q58 and Q59 make a pair. The transistors Q60 and Q61 are of the P-channel type. The transistors Q60 and Q61 make a pair. The transistors Q54, Q56, Q58, and Q60 are connected in series or tandem between the power feed lines 82 and 83. Similarly, the transistors Q55, Q57, Q59, and Q61 are connected in series or tandem between the power feed lines 82 and 83.

The transistors Q54–Q57 are arranged in a cascode connection forming an active load 86 on the differential pair of the transistors Q51 and Q52. The transistors Q54–Q57 correspond to load transistors. The gates of the transistors Q53, Q54, and Q55 are connected in common, being subjected to the bias setting voltage VBIAS3. The gates of the transistors Q56 and Q57 are connected in common, being subjected to a bias setting voltage VBIAS5.

The transistors Q60 and Q61 form a constant current circuit which folds the output currents from the differential pair of the transistors Q51 and Q52 to direct them into the active load 86. The gates of the transistors Q60 and Q61 are connected in common, being subjected to a bias setting voltage VBIAS1.

The pair of the transistors Q58 and Q59 is connected between the active load 86 and the constant current circuit formed by the transistors Q60 and Q61. The transistors Q58 and Q59 suppress the occurrence of the mirror effect in the transistors Q51 and Q52. The source of the transistor Q58 is connected with the drains of the transistors Q51 and Q60. The source of the transistor Q59 is connected with the drains of the transistors Q52 and Q61. The gates of the transistors Q58 and Q59 are connected in common, being subjected to a bias setting voltage VBIAS2.

The drains of the transistors Q56 and Q58 are connected with each other. The junction between the drains of the transistors Q56 and Q58 corresponds to a negative output terminal (a minus output terminal) 87 of the differential amplification circuit. Similarly, the drains of the transistors Q57 and Q59 are connected with each other. The junction between the drains of the transistors Q57 and Q59 corresponds to a positive output terminal (a plus output terminal) 88 of the differential amplification circuit.

The operational amplifier 81 includes an N-channel MOS transistor Q62 and a P-channel MOS transistor Q64 composing a negative-side voltage amplification circuit (a minus-side voltage amplification circuit). The transistor Q62 forms a lower-side portion of the negative-side voltage amplification circuit while the transistor Q64 forms an upper-side portion thereof. The transistors Q62 and Q64 are connected in series between the power feed lines 82 and 83. The drains of the transistors Q62 and Q64 are connected to each other, forming a common drain. The common drain of the transistors Q62 and Q64 leads to a negative-side amplifier output terminal (a minus-side amplifier output terminal) OUTM at which a negative-side amplifier output voltage (a minus-side amplifier output voltage) appears. The gate of the transistor Q62 corresponds to a lower-side input terminal 89 of the negative-side voltage amplification circuit. The gate of the transistor Q64 corresponds to an upper-side input terminal 98 of the negative-side voltage amplification circuit.

A capacitor C51 is connected between the negative output terminal 87 of the differential amplification circuit and the lower-side input terminal 89 of the negative-side voltage amplification circuit. The capacitor C51 has a first terminal 51a connected to the differential amplification circuit, and a second terminal 51b connected to the negative-side voltage amplification circuit.

The drain of an N-channel MOS transistor Q66 is connected to the junction between the terminal 51b of the capacitor C51 and the gate of the transistor Q62. The source of the transistor Q66 is connected with the drain and the gate of an N-channel MOS transistor Q71. The gate of the transistor Q66 is subjected to a control signal VINIT. The transistor Q66 acts as a switch for selectively charging the capacitor C51 in response to the control signal VINIT.

A capacitor C53 is connected between the negative output terminal 87 of the differential amplification circuit and the upper-side input terminal 98 of the negative-side voltage amplification circuit. The capacitor C53 has a first terminal 53c connected to the differential amplification circuit, and a second terminal 53d connected to the negative-side voltage amplification circuit.

An analog switch 90 subjected to a bias setting voltage VBIAS4 is connected to the junction among the negative output terminal 87 of the differential amplification circuit, the terminal 51a of the capacitor C51, and the terminal 53c of the capacitor C53. An analog switch 91 subjected to a bias setting voltage VBIAS6 is connected to the junction between the terminal 53d of the capacitor C53 and the gate of the transistor Q64. The switches 90 and 91 receive the control signal VINIT. An inverter circuit 92 receives the control signal VINIT, and inverts the logic state thereof. The switches 90 and 91 receive an inversion of the control signal VINIT from the inverter circuit 92. The switches 90 and 91 act as a switch for selectively charging the capacitor C53 in response to the control signal VINIT. The switch 90 also acts as a switch for selectively charging the capacitor C51 in response to the control signal VINIT.

The operational amplifier 81 includes an N-channel MOS transistor Q63 and a P-channel MOS transistor Q65 composing a positive-side voltage amplification circuit (a plus-side voltage amplification circuit). The transistor Q63 forms a lower-side portion of the positive-side voltage amplification circuit while the transistor Q65 forms an upper-side portion thereof. The transistors Q63 and Q65 are connected in series between the power feed lines 82 and 83. The drains of the transistors Q63 and Q65 are connected to each other, forming a common drain. The common drain of the transistors Q63 and Q65 leads to a positive-side amplifier output terminal (a plus-side amplifier output terminal) OUTP at which a positive-side amplifier output voltage (a plus-side amplifier output voltage) appears. The gate of the transistor Q63 corresponds to a lower-side input terminal 93 of the positive-side voltage amplification circuit. The gate of the transistor Q65 corresponds to an upper-side input terminal 99 of the positive-side voltage amplification circuit.

A capacitor C52 is connected between the positive output terminal 88 of the differential amplification circuit and the lower-side input terminal 93 of the positive-side voltage amplification circuit. The capacitor C52 has a first terminal 52a connected to the differential amplification circuit, and a second terminal 52b connected to the positive-side voltage amplification circuit.

The drain of an N-channel MOS transistor Q67 is connected to the junction between the terminal 52b of the capacitor C52 and the gate of the transistor Q63. The source of the transistor Q67 is connected with the drain and the gate of the transistor Q71. The gate of the transistor Q67 is subjected to the control signal VINIT. The transistor Q67 acts as a switch for selectively charging the capacitor C52 in response to the control signal VINIT.

A capacitor C54 is connected between the positive output terminal 88 of the differential amplification circuit and the upper-side input terminal 99 of the positive-side voltage amplification circuit. The capacitor C54 has a first terminal 54c connected to the differential amplification circuit, and a second terminal 54d connected to the positive-side voltage amplification circuit.

An analog switch 94 subjected to the bias setting voltage VBIAS4 is connected to the junction among the positive output terminal 88 of the differential amplification circuit, the terminal 52a of the capacitor C52, and the terminal 54c of the capacitor C54. An analog switch 95 subjected to the bias setting voltage VBIAS6 is connected to the junction between the terminal 54d of the capacitor C54 and the gate of the transistor Q65. The switches 94 and 95 receive the control signal VINIT. The switches 94 and 95 receive the inversion of the control signal VINIT from the inverter circuit 92. The switches 94 and 95 act as a switch for selectively charging the capacitor C54 in response to the control signal VINIT. The switch 94 also acts as a switch for selectively charging the capacitor C52 in response to the control signal VINIT.

The operational amplifier 81 includes P-channel MOS transistor Q72 and Q73 composing a current mirror. The sources of the transistors Q72 and Q73 are connected in common, being subjected to the positive potential of the constant power supply voltage VDD. The drain of the transistor Q72 is connected with the drain of the transistor Q71. The source of the transistor Q71 is grounded, being subjected to the negative potential of the constant power supply voltage VDD. The gate of the transistor Q72, the gate of the transistor Q73, and the drain of the transistor Q73 are connected in common to one end of a resistor 96. The other end of the resistor 96 is grounded, being subjected to the negative potential of the constant power supply voltage VDD. The resistor 96 determines the levels of currents flowing through the transistors Q72 and Q73. Thus, the resistor 96 determines the level of a current flowing through the transistor Q71. Provided that the transistor Q66 is in an on state, the transistors Q62 and Q71 compose a current mirror. Provided that the transistor Q67 is in an on state, the transistors Q63 and Q71 compose a current mirror. Accordingly, the resistor 96 determines the levels of currents flowing through the transistors Q62 and Q63.

A common-mode feedback (CMFB) circuit 97 is connected between the negative-side amplifier output terminal OUTM and the positive-side amplifier output terminal OUTP. The common-mode feedback circuit 97 provides a reference direct-current voltage level for a voltage signal outputted from the operational amplifier 81.

Operation of the operational amplifier 81 can be changed between a normal amplification mode and a bias setting mode. When the control signal VINIT is in its low level state, the operational amplifier 81 operates in the normal amplification mode. On the other hand, when the control signal VINIT is in its high level state, the operational amplifier 81 operates in the bias setting mode.

When the control signal VINIT changes from its low level state to its high level state, the transistor Q66 and the switches 90 and 91 assume their on states. As a result, the bias setting voltage VBIAS4 is applied to the terminal 51a of the capacitor C51 via the switch 90. On the other hand, the transistor Q66 establishes the connection of the terminal 51b of the capacitor C51 with the drain of the transistor Q71. Therefore, the voltage at the drain of the transistor Q71 is applied to the terminal 51b of the capacitor C51. Thus, a specific bias voltage equal to a prescribed level is applied between the terminals 51a and 51b of the capacitor C51 as a charging voltage. Accordingly, the capacitor C51 is charged. At the same time, the bias setting voltage VBIAS4 is applied to the terminal 53c of the capacitor C53 via the switch 90. The bias setting voltage VBIAS6 is applied to the terminal 53d of the capacitor C53 via the switch 91. Thus, a specific bias voltage equal to a prescribed level is applied between the terminals 53c and 53d of the capacitor C53 as a charging voltage. Accordingly, the capacitor C53 is charged.

When the control signal VINIT changes from its low level state to its high level state, the transistor Q67 and the switches 94 and 95 assume their on states. As a result, the bias setting voltage VBIAS4 is applied to the terminal 52a of the capacitor C52 via the switch 94. On the other hand, the transistor Q67 establishes the connection of the terminal 52b of the capacitor C52 with the drain of the transistor Q71. Therefore, the voltage at the drain of the transistor Q71 is applied to the terminal 52b of the capacitor C52. Thus, a specific bias voltage equal to a prescribed level is applied between the terminals 52a and 52b of the capacitor C52 as a charging voltage. Accordingly, the capacitor C52 is charged. At the same time, the bias setting voltage VBIAS4 is applied to the terminal 54c of the capacitor C54 via the switch 94. The bias setting voltage VBIAS6 is applied to the terminal 54d of the capacitor C54 via the switch 95. Thus, a specific bias voltage equal to a prescribed level is applied between the terminals 54c and 54d of the capacitor C54 as a charging voltage. Accordingly, the capacitor C54 is charged.

After the capacitors C51, C52, C53, and C54 are fully charged, the control signal VINIT is changed from its high level state to its low level state. In this case, the normal amplification mode of operation of the operational amplifier 81 is started. When the control signal VINIT is changed from its high level state to its low level state, the transistor Q66 and the switches 90 and 91 assume their off states. Therefore, the junction between the terminal 51b of the capacitor C51 and the gate of the transistor Q62 falls into a high-impedance state, and the charges continue to be stored in the capacitor C51. Accordingly, the voltage between the terminals 51a and 51b of the capacitor C51 is held at a value equal to the related specific bias voltage, that is, the voltage occurring immediately before the change of the control signal VINIT to its low level state. Therefore, the capacitor C51 acts as a level shift circuit which couples the negative output terminal 87 of the differential amplification circuit with the lower-side input terminal 89 of the negative-side voltage amplification circuit while providing a level shift corresponding to the related specific bias voltage. Accordingly, not only an alternating-current signal but also a direct-current signal can be transmitted from the differential amplification circuit to the lower-side portion of the negative-side voltage amplification circuit. Since the switch 91 assumes its off state, the junction between the terminal 53d of the capacitor C53 and the gate of the transistor Q64 falls into a high-impedance state so that the charges continue to be stored in the capacitor C53. Accordingly, the voltage between the terminals 53c and 53d of the capacitor C53 is held at a value equal to the related specific bias voltage, that is, the voltage occurring immediately before the change of the control signal VINIT to its low level state. Therefore, the capacitor C53 acts as a level shift circuit which couples the negative output terminal 87 of the differential amplification circuit with the upper-side input terminal 98 of the negative-side voltage amplification circuit while providing a level shift corresponding to the related specific bias voltage. Accordingly, not only an alternating-current signal but also a direct-current signal can be transmitted from the differential amplification circuit to the upper-side portion of the negative-side voltage amplification circuit.

When the control signal VINIT is changed from its high level state to its low level state, the transistor Q67 and the switches 94 and 95 assume their off states. Therefore, the junction between the terminal 52b of the capacitor C52 and the gate of the transistor Q63 falls into a high-impedance state, and the charges continue to be stored in the capacitor C52. Accordingly, the voltage between the terminals 52a and 52b of the capacitor C52 is held at a value equal to the related specific bias voltage, that is, the voltage occurring immediately before the change of the control signal VINIT to its low level state. Therefore, the capacitor C52 acts as a level shift circuit which couples the positive output terminal 88 of the differential amplification circuit with the lower-side input terminal 93 of the positive-side voltage amplification circuit while providing a level shift corresponding to the related specific bias voltage. Accordingly, not only an alternating-current signal but also a direct-current signal can be transmitted from the differential amplification circuit to the lower-side portion of the positive-side voltage amplification circuit. Since the switch 95 assumes its off state, the junction between the terminal 54d of the capacitor C54 and the gate of the transistor Q65 falls into a high-impedance state so that the charges continue to be stored in the capacitor C54. Accordingly, the voltage between the terminals 54c and 54d of the capacitor C54 is held at a value equal to the related specific bias voltage, that is, the voltage occurring immediately before the change of the control signal VINIT to its low level state. Therefore, the capacitor C54 acts as a level shift circuit which couples the positive output terminal 88 of the differential amplification circuit with the upper-side input terminal 99 of the positive-side voltage amplification circuit while providing a level shift corresponding to the related specific bias voltage. Accordingly, not only an alternating-current signal but also a direct-current signal can be transmitted from the differential amplification circuit to the upper-side portion of the positive-side voltage amplification circuit.

What is claimed is:

1. An operational amplifier comprising:
    a differential amplification circuit including load transistors arranged in a cascode connection;
    a voltage amplification circuit forming a stage following the differential amplification circuit;
    a capacitor coupling the differential amplification circuit and the voltage amplification circuit with each other; and
    a bias setting circuit for charging the capacitor to a prescribed bias voltage before amplification is started.

2. An operational amplifier as recited in claim 1, wherein the charged capacitor sets the differential amplification circuit in a prescribed biased state.

3. An operational amplifier as recited in claim 1, wherein the capacitor is interposed in a connection path between an output terminal of the differential amplification circuit and an input terminal of the voltage amplification circuit.

4. An operational amplifier as recited in claim 3, wherein the capacitor includes first and second terminals connected to the output terminal of the differential amplification circuit and the input terminal of the voltage amplification circuit respectively.

5. An operational amplifier as recited in claim 4, wherein the voltage amplification circuit includes a transistor having a gate connected with the input terminal of the voltage amplification circuit, and the bias setting circuit comprises a first switch circuit for applying a first bias setting voltage to the first terminal of the capacitor, and a second switch circuit for applying a second bias setting voltage to the second terminal of the capacitor.

6. An operational amplifier as recited in claim 5, wherein the second switch circuit is connected between the second terminal of the capacitor and a drain of the transistor.

7. An operational amplifier as recited in claim 5, wherein the bias setting circuit further comprises a third switch circuit connected between the output terminal of the differential amplification circuit and the first terminal of the capacitor.

8. An operational amplifier as recited in claim 4, wherein the voltage amplification circuit includes a first transistor having a gate connected with the input terminal of the voltage amplification circuit, and a second transistor connected in series with the first transistor, and further comprising a second capacitor connected between a gate of the second transistor and one of the first and second terminals of the capacitor coupling the differential amplification circuit and the voltage amplification circuit with each other, and a second bias setting circuit for charging the second capacitor to a prescribed bias voltage before amplification is started.

9. An operational amplifier as recited in claim 1, wherein the voltage amplification circuit has a plurality of input terminals and the differential amplification circuit has an output terminal, and the output terminal of the differential amplification circuit is connected with the input terminals of the voltage amplification circuit via a plurality of capacitors including the capacitor coupling the differential amplification circuit and the voltage amplification circuit with each other.

10. An operational amplifier comprising:

a differential amplification circuit including load transistors arranged in a cascode connection;

a voltage amplification circuit forming a stage following the differential amplification circuit;

a capacitor coupling the differential amplification circuit and the voltage amplification circuit with each other;

first means for charging the capacitor into a charged state during a first term; and second means for holding the capacitor in the charged state during a second term after the first term.

11. An operational amplifier comprising:

a differential amplification circuit including load transistors arranged in a cascode connection;

a voltage amplification circuit forming a stage following the differential amplification circuit;

first and second transistors included in the voltage amplification circuit and connected in series, the first transistor being of a first conductivity type, the second transistor being of a second conductivity type opposite to the first conductivity type;

a first capacitor coupling the differential amplification circuit and the first transistor with each other;

first means for charging the first capacitor into a charged state during a first term;

second means for holding the first capacitor in the charged state during a second term after the first term;

a second capacitor coupling the differential amplification circuit and the second transistor with each other;

third means for charging the second capacitor into a charged state during the first term; and fourth means for holding the second capacitor in the charged state during the second term.

* * * * *